United States Patent [19]
Kapoor et al.

[11] Patent Number: 5,598,026
[45] Date of Patent: Jan. 28, 1997

[54] LOW DIELECTRIC CONSTANT INSULATION LAYER FOR INTEGRATED CIRCUIT STRUCTURE AND METHOD OF MAKING SAME

[75] Inventors: Ashok K. Kapoor, Palo Alto; Nicholas F. Pasch, Pacifica, both of Calif.

[73] Assignee: LSI Logic Corporation, Milpitas, Calif.

[21] Appl. No.: 464,309

[22] Filed: Jun. 5, 1995

Related U.S. Application Data

[62] Division of Ser. No. 84,821, Jun. 28, 1993, Pat. No. 5,470,801.

[51] Int. Cl.⁶ .................. H01L 23/58; H01L 31/0352
[52] U.S. Cl. .................. 257/634; 257/637; 257/641; 257/644; 257/650
[58] Field of Search .................. 257/634, 637, 257/641, 644, 650

[56] References Cited

U.S. PATENT DOCUMENTS

| | | | |
|---|---|---|---|
| 3,615,941 | 10/1971 | Yamada et al. | 148/187 |
| 3,853,496 | 12/1974 | Kim | 29/571 |
| 3,878,131 | 4/1975 | Hayes | 502/330 |
| 3,951,782 | 4/1976 | Buss | 208/139 |
| 4,242,791 | 1/1981 | Horng et al. | 29/578 |
| 4,334,349 | 6/1982 | Aoyama et al. | 29/579 |
| 4,368,573 | 1/1983 | deBrebisson et al. | 29/569 R |
| 4,445,267 | 5/1984 | De La Moneda et al. | 29/571 |
| 4,481,283 | 11/1984 | Kerr et al. | 430/319 |
| 4,490,737 | 12/1984 | Pierce et al. | 257/634 |
| 4,654,113 | 3/1987 | Tuchiya et al. | 156/643 |
| 4,795,722 | 1/1989 | Welch et al. | 437/192 |
| 4,902,650 | 2/1990 | Caldwell et al. | 501/12 |
| 4,931,354 | 6/1990 | Wakino et al. | 428/209 |
| 4,972,251 | 11/1990 | Lehrer | 257/637 |
| 5,103,288 | 4/1992 | Sakamota et al. | 357/71 |
| 5,254,497 | 10/1993 | Liu | 437/173 |
| 5,278,103 | 1/1994 | Mallon et al. | 437/240 |
| 5,470,801 | 11/1995 | Kapoor et al. | 437/238 |

FOREIGN PATENT DOCUMENTS

| | | | |
|---|---|---|---|
| 59-158526 | 9/1984 | Japan | H01L 21/314 |
| 61-289649 | 12/1986 | Japan | H01L 21/88 |

OTHER PUBLICATIONS

Ghandhi, Sorab K., *VLSI Fabrication Principles Silicon and Gallium Arsenide*, New York: John Wiley & Sons, 1983, pp. 517–520.

Liu, W. S., et al., "Instability of a $Ge_xSi_{1-x}O_2$ Film on a $Ge_xSi_{1-x}$ Layer", *Journal of Applied Physics*, vol. 72, No. 9, Nov. 1, 1992, pp. 4444–4446.

Wolf, Stanley, et al., *Silicon Processing for the VLSI Era*, vol. 1: *Process Technology*, Sunset Beach, California: Lattice Press, 1986, 225–226.

*Primary Examiner*—Mahshid D. Saadat
*Assistant Examiner*—Jhihan B. Clark
*Attorney, Agent, or Firm*—John P. Taylor

[57] ABSTRACT

A low dielectric insulation layer for an integrated circuit structure material, and a method of making same, are disclosed. The low dielectric constant insulation layer comprises a porous insulation layer, preferably sandwiched between non-porous upper and lower insulation layers. The presence of some gases such as air or an inert gas, or a vacuum, in the porous insulation material reduces the overall dielectric constant of the insulation material, thereby effectively reducing the capacitance of the structure. The porous insulation layer is formed by a chemical vapor deposition of a mixture of the insulation material and a second extractable material; and then subsequently selectively removing the second extractable material, thereby leaving behind a porous matrix of the insulation material, comprising the low dielectric constant insulation layer.

7 Claims, 2 Drawing Sheets

LOW DIELECTRIC CONSTANT INSULATION LAYER FOR INTEGRATED CIRCUIT STRUCTURE AND METHOD OF MAKING SAME

CROSS-REFERENCE TO RELATED APPLICATIONS

This application is a division of application Ser. No. 08/084,821, filed Jun. 28, 1993, and now issued as U.S. Pat. No. 5,470,801 on Nov. 28, 1995.

BACKGROUND OF THE INVENTION

1. Field of the Invention

This invention relates to integrated circuit structures. More particularly, this invention relates to one or more low dielectric constant insulation layers formed on an integrated circuit structure and a method of making same.

2. Description of the Related Art

In the formation of integrated circuit structures, patterned conductive layers must be used to provide electrical interconnection between active and passive devices comprising the integrated circuit structure.

However, the shrinkage of feature sizes in such integrated circuit structures includes shrinkage of the horizontal spacing between adjacent conductors on the same plane. However, such shrinkage of feature size results in a corresponding rise in the impedance of the conductors, as well as crosstalk between the conductors. Such increases in impedance in the integrated circuit structure can result in degradation of the performance of the integrated circuit structure, e.g., reduce the response time of the active devices by increasing the impedance of the lines.

It would, therefore, be desirable if one could reduce the amount of capacitance formed between adjacent lines, either horizontally or vertically, to thereby reduce the impedance of the lines.

Theoretically, this could be done by substituting a different insulation material having a lower dielectric constant, e.g., using some insulation material other than the commonly used $SiO_2$, or by somehow reducing the dielectric constant of the particular insulation material being used, e.g., somehow reducing the dielectric constant of a $SiO_2$ insulation layer.

Of these two alternatives, it has been demonstrated to be preferable to achieve such a lowering of capacitance without the substitution of new insulation materials into the integrated circuit structure.

SUMMARY OF THE INVENTION

In accordance with the invention, a low dielectric constant insulation material is provided which comprises a porous insulation layer, preferably sandwiched between non-porous upper and lower insulation layers. The presence of some gases such as, for example, air or an inert gas, or a vacuum, in the porous insulation material can reduce the overall dielectric constant of the insulation material, thereby effectively reducing the capacitance of the structure. The porous insulation layer may be formed by first forming a composite layer of an extractable material and a matrix-forming insulation material over the integrated circuit structure on a semiconductor wafer, and then selectively removing the extractable material from the matrix-forming material, without damaging the remaining matrix material, thereby leaving behind a porous matrix of the insulation material. The extractable material is removed by first dissolving it in a liquid which is not a solvent for the matrix-forming material to form a solution. This solution is then preferably removed from the matrix-forming material by vacuum drying the layer at an elevated temperature.

DETAILED DESCRIPTION OF THE INVENTION

The invention comprises a low dielectric constant insulation layer formed on an integrated circuit structure on a semiconductor wafer by deposition of a composite layer onto the wafer comprising a mixture of at least two materials, at least one of which comprises a non-extractable matrix-forming insulation material, and at least one other of which comprises an extractable material. The extractable material is removed by first dissolving it in a liquid which is not a solvent for the matrix-forming material to form a solution. This solution is then preferably removed from the matrix-forming material by vacuum drying the layer at an elevated temperature, leaving a porous insulation layer comprising the remaining material or materials. The presence of air in the porous insulation material reduces the overall dielectric constant of the insulation material, thereby effectively reducing the capacitance of the structure.

Such a low dielectric constant insulation layer is useful when forming an insulation layer between two conductive layers such as, for example, between a conductive silicon layer (e.g., a doped polysilicon layer) and the first metallization layer; or between metallization layers (or metal lines on the same layer) to thereby lower the effective capacitance between the conductive layers separated by such a low dielectric constant insulation layer.

By use of the term herein "low dielectric constant", in describing the resulting porous insulation material, is meant a dielectric constant of less than about 3.9, in contrast, for example, to a conventional $SiO_2$ insulation material having a dielectric constant of 3.9.

Figure 1:
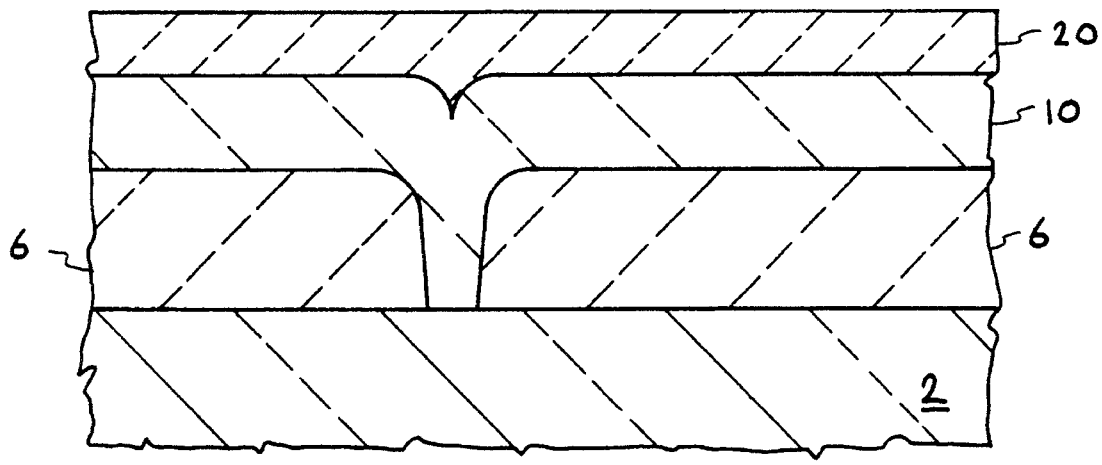
FIG. 1 is a fragmentary vertical cross-sectional view showing, in its simplest form, construction of a composite layer from which the low dielectric constant insulation layer of the invention will be formed.

Referring now to FIG. 1, the invention is shown in its simplest form wherein a conductive polysilicon layer 10 is shown formed over oxide portions 6 and an integrated circuit structure, generally designated at 2. A composite layer of material 20, from which the low dielectric insulation layer of the invention will be formed, is shown deposited directly over polysilicon layer 10.

The low dielectric constant insulation layer of the invention is formed by first forming a composite layer, such as composite layer 20 shown in FIG. 1, comprising a mixture of two or more materials, at least one of which is extractable from the mixture after the layer is formed, and at least one of which will remain after such extraction as a porous matrix comprising the low dielectric constant insulation material. In its simplest form, a binary mixture will be used to form the composite layer, with one material (which may or may not be an insulative material) subsequently extracted from the composite layer and one material (which will be an insulation material) remaining after such extraction. However, it will be appreciated that it within the scope of the invention to use two or more materials as the materials to be extracted, or as the matrix-forming materials which will remain as the low dielectric constant insulation material after the extraction, or any combination thereof, in the initial formation of the composite layer.

The material or materials used in the composite layer which will subsequently be extracted may comprise any material capable of being deposited with the remaining material or materials to form the composite layer as a substantially homogeneous mixture and then subsequently selectively extracted from the composite layer while leaving the remaining material as a porous matrix. Since the extractable materials will be substantially removed from the composite layer, it is not mandatory that the extractable materials be insulation materials. However, it is preferable that insulation materials be used as the extractable material since it is possible that all of the extractable material may not be removed, either by choice or based on the economics of achieving full removal. Preferably the extractable material or materials will be easily extractable selectively from the remaining insulation material by solvents which may be used without any deleterious effects noted either on the remaining insulation material or any other exposed portions of the integrated circuit structure.

An example of an extractable material which may be used to form the composite layer comprises germanium oxide, which may be represented by the formula $GeO_x$ where x ranges between 1 and 2. Other extractable materials which may be used in the formation of the composite layer may include, for example, a germanium sulfide or a silicon sulfide.

The non-extractable insulation material used in forming the composite layer will, in its simplest form, typically comprise an oxide of silicon, e.g., $SiO_2$. However, the use of other materials such as silicon nitride ($Si_3N_4$) either in place of, or in a mixture with, an oxide of silicon should be deemed to be within the scope of the invention. Other materials which could be used, either separately or in combination with an oxide of silicon and/or silicon nitride, as the non-extractable insulation material, i.e., the material which will comprise the low dielectric constant insulation layer after removal of the extractable material, include, for example, aluminum oxide ($Al_2O_3$), mixtures of any of the above, or an organic polymer such as polyimide.

The ratio of matrix-forming material to extractable material in the resulting composite layer may range from as little as 0.5 wt. % matrix-forming material up to as high as 50 wt. % or even higher if so desired. Usually the matrix-forming will comprise at least about 5 wt. % of the mixture and may be a higher minimum amount, depending upon the minimum desired structural integrity or strength of the matrix of porous non-extractable material remaining after the extraction step. The desired strength of the matrix may, in turn, depend upon the particular liquid and process parameters used to carry out the extraction, as will be discussed below.

It should also be noted that the ratio of matrix-forming material to extractable material will affect the amount or degree of lowering of the dielectric constant of the remaining porous matrix after removal of the extractable material. Therefore, the minimum amount of matrix-forming material used in the formation of the composite layer will usually be dependent upon the desired (and necessary) minimum strength of the resulting porous matrix left after removal of the extractable material, while the maximum amount of matrix-forming material used in the mixture to form the composite layer will be dependent upon the desired lowering of the dielectric constant of the final porous low dielectric constant insulation layer of the invention. Since both minimum mechanical strength and dielectric constant change will be dependent upon the type of material used as the matrix-forming material, and since neither parameter will necessarily vary linearly with concentration, determination of the exact ratio of matrix-forming material to extractable material to be used for a given composite layer will be determined empirically for each particular case.

In the formation of the composite layer, one or more dopants may also be added, for example, to permit the resulting composite layer to flow at a lower temperature, either during the deposition or upon subsequent heating, for planarization purposes. From 0 to 5 wt. % (based on the weight of the non-extractable portion of the composite mixture) of either boron, phosphorus, or arsenic dopants, or mixtures of same, may be used, with the total weight of the dopants in the resulting composite layer not exceeding about 10 wt. % of the non-extractable materials in the composite layer.

The thickness of the composite layer will vary depending upon the desired application and the structural integrity of the insulation material which remains after the extraction. Typically, the thickness of the composite layer may range from as low as about 200 Angstroms to as much as about 20,000 Angstroms, or even thicker in particular instances.

Since the resulting low dielectric constant layer, after the extraction, will be a porous layer, impurities (including dopants) trapped within the porous layer, or included in the non-extracted material, may gradually move to the surface of the low dielectric constant layer which could cause reliability problems. Therefore, in a preferred embodiment of the invention, the low dielectric constant insulation layer is formed with one or more lower and upper solid encapsulation layers of insulation materials which will prevent or inhibit such impurity migration. Such solid encapsulation layers may, for example, simply comprise conventionally deposited $SiO_2$ layers or dual layers of $SiO_2$ and $Si_3N_4$, as will be further described below. Such optional encapsulation layers may range in thickness, for example, from as little as 100 Angstroms to as much as 1000 Angstroms or even higher, if necessary or desired.

Figure 2:
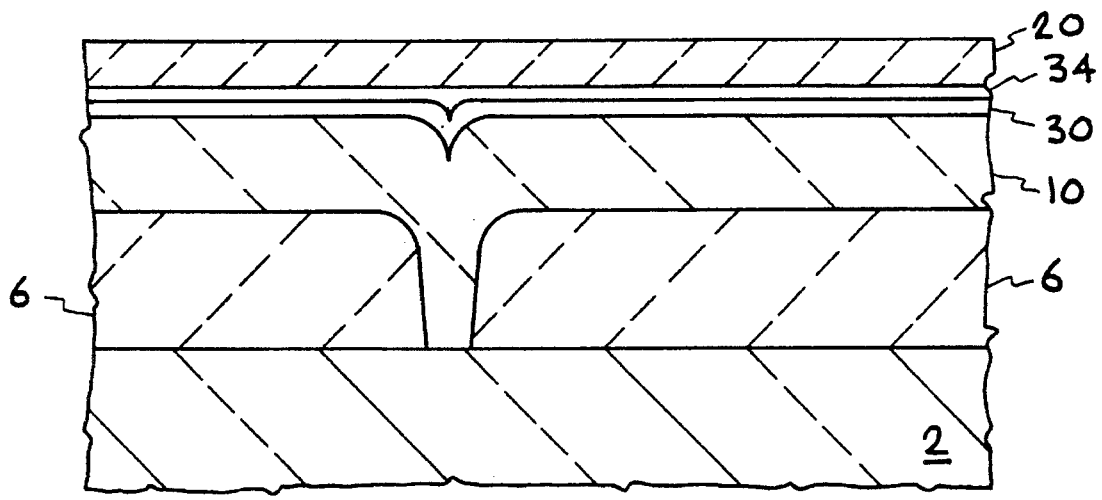
FIG. 2 is a fragmentary vertical cross-sectional view showing construction of the composite layer over a dual layer of non-porous insulation material which prevent materials such as dopants in the low dielectric constant insulation layer to be formed from the composite layer from migrating downwardly into portions of the integrated circuit structure below.
Figure 3:
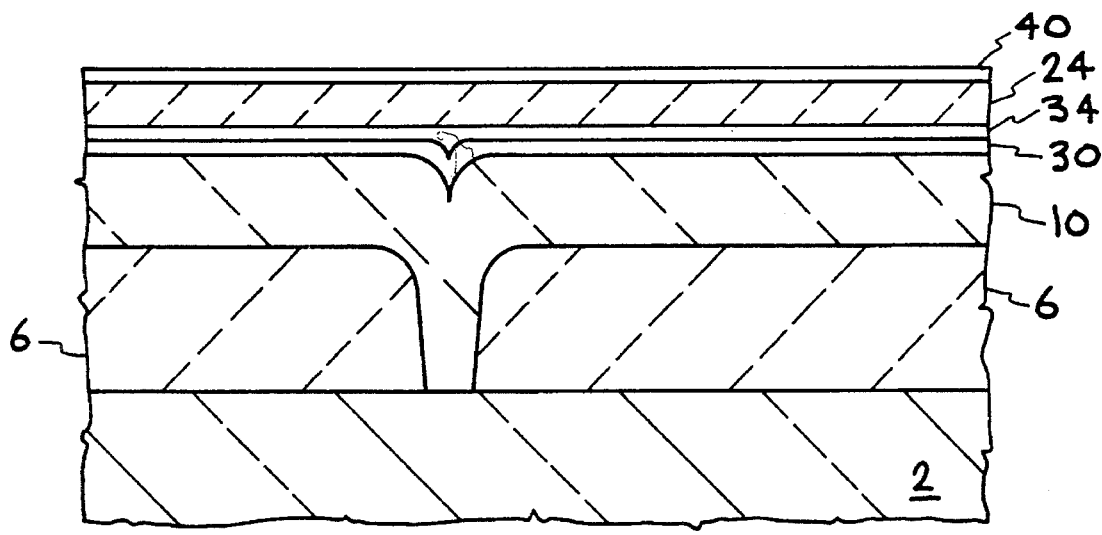
FIG. 3 is a fragmentary vertical cross-sectional view of the structure of FIG. 2 after formation of a single encapsulation layer over the low dielectric constant insulation layer to prevent upward migration of such impurities.

The use of such solid encapsulation or capping layers is illustrated in FIG. 2 wherein a first solid insulation layer 30 of silicon oxide is illustrated as formed over conductive polysilicon layer 10 of FIG. 1. A second solid insulation layer 34, which may comprise silicon nitride, is shown formed over insulation layer 30. Together, insulation layers 30 and 34 comprise a dual encapsulation or capping layer which serves to seal the underlying portions of integrated circuit structure 2 and polysilicon layer 10 from composite layer 20 which is shown formed over layer 34. As shown in FIG. 3, an upper capping or sealing layer 40, which may also comprise $SiO_2$, can then be formed over the structure after the extractable material has been removed to form low dielectric constant porous insulation layer 24 of the invention (formerly composite layer 20 of FIG. 2), as will now be described. While the lower encapsulation or capping layer has been shown formed from two layers of material (layers 30 and 34) and upper capping layer 40 is shown as a single layer, it will be understood that this is only for illustrative purposes and either the lower or upper encapsulation layer may comprise either a single layer or a dual layer as desired.

By way of illustration, and not of limitation, the formation of the composite layer will be hereinafter described with respect to the formation of a composite comprising a mixture of silicon oxide ($SiO_2$) and germanium oxide ($GeO_x$), where x ranges from 1 to 2.

The mixture of silicon oxide and germanium oxide may be deposited over the underlying surface on the integrated circuit structure by a conventional chemical vapor deposition (CVD) process, e.g., by flowing a mixture of silane and germane (and optionally one or more dopant gases) into a chamber maintained at atmospheric pressure or under vacuum, e.g., as low as a few Torr, while a wafer temperature of from about 20° C. to about 500° C., preferably from about 300° C. to about 450° C., is maintained. The flow rates of the respective gases into the vacuum chamber will depend upon the size of the chamber and the desired deposition rate, while the ratio of the gases to one another will be dependent upon the desired ratio in the composite layer being deposited. The deposition time will be dependent upon the desired thickness of the composite layer.

Other deposition processes can be used such as, for example, a low temperature oxide (LTO) deposition process wherein the wafer temperature during deposition is maintained within a range of from about room temperature, i.e. about 20° C. to about 500° C., preferably from about 300° C. to about 450° C. A conventional plasma-enhanced chemical vapor deposition (PECVD) process may also be used to form the composite layer of $SiO_2$ and $GeO_x$, using a plasma.

It is also possible to form the composite layer as a gel, as is more fully described in U.S. Pat No. 5,395,217 entitled PROCESS FOR FORMING LOW DIELECTRIC CONSTANT INSULATION LAYER ON INTEGRATED CIRCUIT STRUCTURE, filed Jun. 28, 1993, day as this application and assigned to the assignee of this application, and the disclosure of which is hereby incorporated by reference into this application. After formation of composite layer 20, the integrated circuit structure may be heated, if desired, to cause layer 20 to flow for planarization purposes. When no metallization is already present on the integrated circuit structure, nor any prior porous insulation layers already formed, the structure may be heated to a temperature of typically from about 200° C. up to about 1100° C., preferably from about 400° C. to about 800° C. If a metallization layer (and/or a first porous insulation layer) already has been formed and the (second) low dielectric constant insulation layer of the invention is being formed between such a metal layer and a subsequent metal layer to be formed thereover, heating of the structure for planarization purposes will be governed by the melting point of the already deposited metal layer (as well as the effect of such a temperature on the previously formed porous layer). For aluminum metallization, for example, the structure should not be heated to a temperature above about 500° C., while for copper, for example, the temperature should not exceed about 1000° C. Of course, it will be recognized that such planarization may also be carried out by chemical or mechanical polishing or a combination thereof. This will be found to be particularly useful in those instances where heating the wafer to cause the composite layer to flow, for planarization purposes, would create problems elsewhere on the structure.

The extractable material may now be removed by contacting the composite layer with a purified liquid which is a solvent for the extractable material, but not for the insulation material which will be left to form the porous low dielectric layer. By use of the term "purified liquid" is meant a semiconductor grade solvent or better. For example, purified water, e.g., distilled or deionized water, may be used to leach out germanium oxide from a silicon oxide/germanium oxide composite layer. This may be carried out, for example, by immersing the coated wafer for a time period of at least about 1 minute up to as long as about 10 hours, or longer if desired, in such a purified liquid solvent which may be maintained at a temperature ranging from ambient up to about just below the vaporization point of the liquid.

A dilute acid (i.e., 1 normal or less) such as HCl, or a dilute base (i.e., 1 normal or less), such as $NH_4OH$ may, in some instances, be used to remove the extractable material provided that other materials, including the non-extractable insulation material in the composite layer, are not attacked by such acid or base.

After contacting the composite layer with the purified liquid solvent, the liquid, and the dissolved material therein, must then be removed from the composite layer. This is best carded out by first replacing the solution in the composite with fresh solvent, i.e., by rinsing the composite in pure solvent (which could be a second solvent miscible with the first solvent) at least once and preferably a number of times until all of the solution, i.e. substantially all of the dissolved extractable material is no longer in the composite. By "substantially all" is meant that less than 99.9 % of the extractable material remains in the resulting porous matrix structure. This may be empirically determined, for example, by monitoring the resistivity of the rinse liquid until the presence of ions (indicating the presence of extractable material) becomes too low to detect, e.g., a resistivity of about 16–17 megohms. If a second solvent is used as the rinse liquid, it too must not be a solvent for the non-extractable material in the composite layer. The solvent which then remains in the composite, e.g., the second liquid, may then be removed by vacuum drying the layer in a vacuum dryer for a period of time ranging from about 10 minutes to about 100 minutes while maintaining the dryer at a pressure within a range of from about 0.1 Torr to about 100 Torr, and while maintaining the semiconductor wafer at a temperature within a range of from about ambient temperature to just below the vaporization temperature of the solvent, preferably within a range of from about 320° C. to about 400° C.

If the composite layer was formed from a gel, as previously discussed, the solvent, e.g., the second liquid, may be removed from the composite layer using a lyophilizing (freeze drying) process or a critical point process wherein the solvent is removed at a pressure and temperature above the critical point of the solvent. Both of these removal processes are more fully described in the aforementioned U.S. Pat. No. 5,393,712.

After the vacuum drying and removal of the solvent, the wafer may be removed from the vacuum dryer, having formed thereon a porous matrix comprising low dielectric constant insulation layer 24 of the invention, as shown in FIG. 3, by virtue of the air in the porous matrix which has replaced or supplanted the extracted material.

At this point, if desired, capping layer 40 of non-porous insulation material may be formed over porous low dielectric constant insulation layer 24, as shown in FIG. 3. Capping layer 40 is formed similarly to the encapsulation layer or layers (30 and 34) formed over the integrated circuit structure beneath porous low dielectric constant insulation layer 24. Such a capping layer may be conventionally formed using the same techniques previously described for forming the lower encapsulation layer. If the use of capping layer 40 is either not desired or needed, this step may, of course, be dispensed with.

Figure 4:
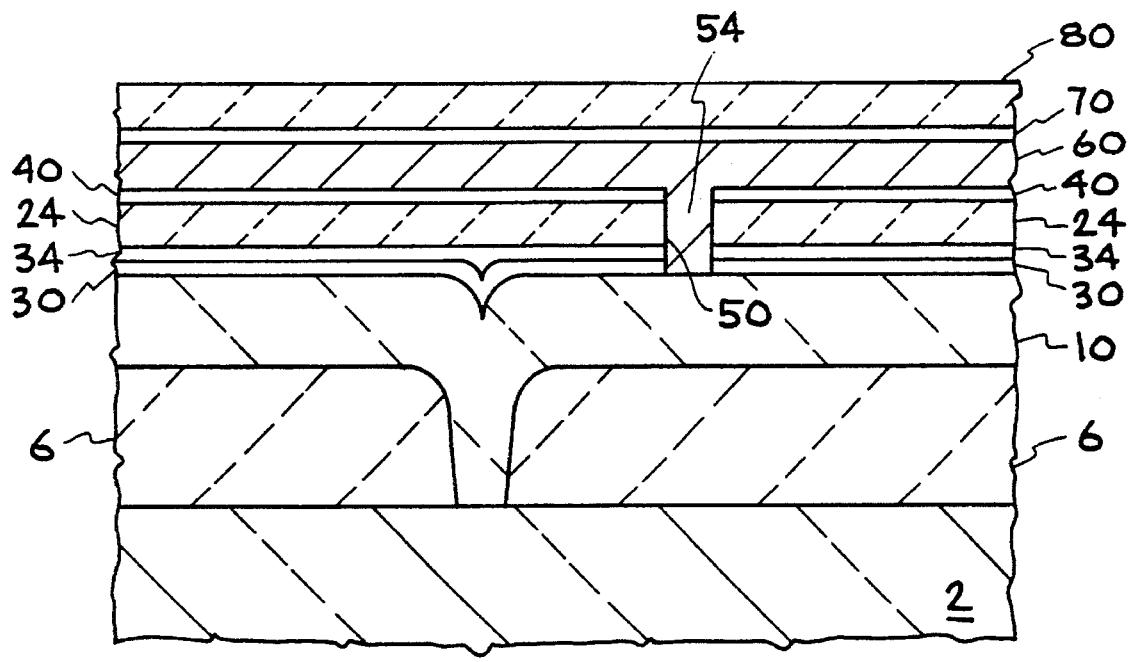
FIG. 4 is a fragmentary vertical cross-sectional view of the structure of FIG. 3 after formation of a contact opening in the first low dielectric constant insulation layer, a patterned first metallization layer formed over the insulation layer, a capping layer formed over the first metallization layer, and a second composite layer deposited in preparation for forming a second low dielectric constant insulation layer.

The resultant low dielectric constant insulation layer may now be conventionally processed, for example to form vias or contact openings 50, as shown in FIG. 4, followed by filling of contact opening with a conductive filler material 54, such as tungsten. A metallization layer 60 is then formed over low dielectric constant insulation layer 24 and capping layer 40 (if used). If capping layer 40 is used, the patterning to form the desired vias or contact openings 50 will be applied over the upper surface of layer 40.

It should be noted that if one or more dopant materials are used in the formation of the low dielectric constant insulation layer, care must be taken in material selection for the filler material to be used in the contact openings. This is because the capping or encapsulation layers placed above and below the low dielectric constant layer will not prevent leaching out or migration of the dopant where the low dielectric constant layer is exposed when the contact opening is cut through the insulation layer. Thus, for example, it may be preferably to use tungsten as a filler material for the contact opening.

Still referring to FIG. 4, the structure shown in FIG. 3 is now shown formed with a contact opening 50 filled with a conductive filler material 54 such as tungsten and a first metallization layer 60 formed over capping layer 40 on first low dielectric constant insulation layer 24. First metallization layer 60 is now patterned to form the desired interconnects.

A capping or encapsulation layer 70 is then formed over first metallization layer 60 in preparation for forming a second low dielectric constant insulation layer over capping layer 70 and first metallization layer 60. This second low dielectric constant insulation layer may be formed in the same manner as first low dielectric constant insulation layer 24, i.e., by first forming a second composite layer 80, which may be identical in composition to first composition layer 20, and then removing the extractable material from it using one of the techniques previously discussed. However, as also previously discussed, care must be exercised if it is desired to heat second composite layer 80 prior to the extraction step to planarize it since the exercise of excessive heat may damage either first metallization layer 60 or first low dielectric constant insulation layer 24.

Figure 5:
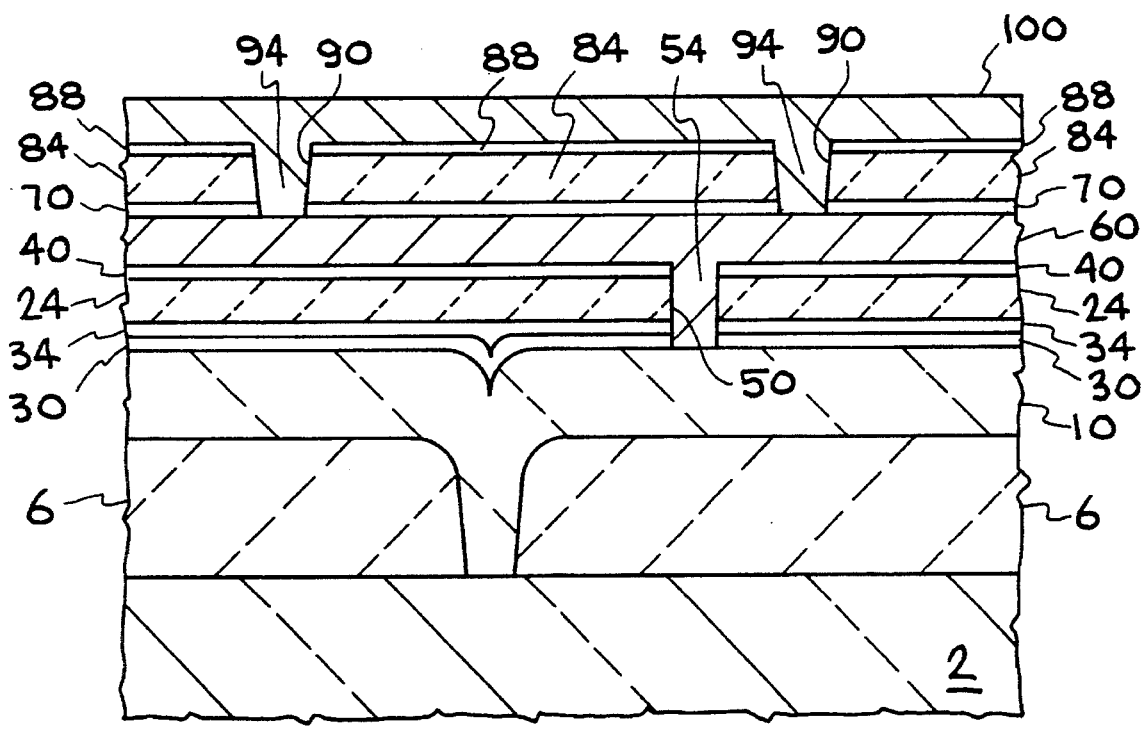
FIG. 5 is a fragmentary vertical cross-sectional view of the structure of FIG. 4 after formation of the second low dielectric constant insulation layer, formation of contact openings therein, and formation of a patterned second metallization layer over the second low dielectric constant insulation layer.

As shown in FIG. 5, after formation of a second low dielectric constant insulation layer 84 from second composite layer 80 shown in FIG. 4, a capping layer 88 may be optionally formed over second low dielectric constant insulation layer 84. Second low dielectric constant insulation layer 84, and capping layer 88 (if formed thereon) may then be patterned to form contact holes 90 to first metallization layer 60. Contact holes 90 may then be filled with conductive filler material 94 similarly to the filling of contact hole 50, and a second metallization layer 100 may then be deposited over the structure and patterned.

This process may then be optionally repeated again as many times as needed or desired to form further low dielectric constant insulation layers, in accordance with the invention, for as many subsequent metallization layers as will be used in the integrated circuit structure.

The following example will serve to further illustrate the invention. A first sealing layer of non-porous $SiO_2$ may be first deposited by CVD over an integrated circuit structure on a semiconductor wafer to a thickness of about 0.1 μm. Then about 1 μm of a composite layer, comprising about 80 wt. % $SiO_2$, 18 wt. % $GeO_2$, and 2 wt. % phosphorus, is deposited by CVD over the newly deposited non-porous $SiO_2$ layer. The composite layer is then contacted with deionized water to dissolve the $GeO_2$ extractable material, to thereby provide a doped solid matrix of $SiO_2$. The resulting aqueous solution of $GeO_2$ and water may then be removed from the composite layer by repeated washings in further deionized water until the rinse water shows no detectable amounts of the extractable material therein, for example, as determined by resistivity testing of the rinse water. The deionized water may now be removed from the composite layer by heating the coated wafer in a vacuum chamber maintained at a pressure of about 1 Torr. The temperature within the chamber is maintained within a range of from about 320° C. to about 400° C. during the removal of the deionized water from the composite layer. After all of the deionized water has been removed, leaving behind the solid matrix of $SiO_2$, the wafer may be removed from the chamber and a further non-porous sealing layer of $SiO_2$ may be deposited over the resulting porous low dielectric constant $SiO_2$ insulation layer to a thickness of about 0.1 μm.

Thus, the invention comprises a low dielectric constant insulation layer and a method of making same wherein an insulation layer is first formed as a composite layer which includes one or more extractable materials which, when removed, leave behind a porous matrix of the insulation material which, due to its porous nature, has a lower dielectric constant, resulting in a lowering of the capacitance within an integrated circuit structure formed with such a low dielectric constant insulation layer or layers.

Having thus described the invention what is claimed is:

1. An integrated circuit structure comprising:
   a) one or more non-porous lower insulation layers selected from the group consisting of an oxide of silicon, silicon nitride, and mixtures of same;
   b) a low dielectric constant insulation layer formed over said one or more non-porous lower insulation layers and comprising:
      i) a porous insulation material comprising a matrix of:
         1) a non-extractable insulation material selected from the group consisting of an oxide of silicon, silicon nitride, aluminum oxide, and mixtures of same, having a dielectric constant of less than about 3.9; and
         2) portions of an extractable insulation material selected from the group consisting of germanium oxide, germanium sulfide, and silicon sulfide; said porous insulation material formed by substantially removing said extractable material from a composite layer comprising a mixture of said non-extractable insulation material and said extractable insulation material; and ii) one or more dopants selected from the group consisting of boron, phosphorus, and arsenic, in an individual amount not exceeding about 5 wt. %, based on the weight of said porous insulation material; and c) one or more non-porous upper insulation layers formed over said low dielectric constant insulation layer and selected from the group consisting of an oxide of silicon, silicon nitride, and mixtures of same;

wherein said one or more non-porous lower insulation layers beneath said low dielectric constant insulation layer, and said one or more non-porous Upper insulation layers above said low dielectric constant insulation layer, inhibit migration of impurities, including said dopants, from said low dielectric constant insulation layer.

2. An integrated circuit structure comprising:

a) one or more non-porous lower insulation layers selected from the group consisting of an oxide of silicon, silicon nitride, and mixtures of same;

b) a low dielectric constant insulation layer formed over said one or more lower insulation layers and comprising:
 i) a porous silicon oxide ($SiO_2$) insulation material having a dielectric constant of less than about 3.9 and formed by substantially removing an extractable germanium oxide material from a composite layer comprising a mixture of said silicon oxide insulation material and said extractable germanium oxide material;
 ii) less than 0.1% of said extractable germanium oxide material remaining from said substantially removing from said composite layer of said extractable germanium oxide material; and
 iii) one or more dopants selected from the group consisting of boron, phosphorus, and arsenic, in an individual amount up to about 5 wt. %, based on the weight of said silicon oxide insulation material; and c) one or more non-porous upper insulation layers formed over said low dielectric constant insulation layer and selected from the group consisting of an oxide of silicon, silicon nitride, and mixtures of same; said one or more non-porous lower insulation layers beneath said low dielectric constant insulation layer, and said one or more non-porous upper insulation layers formed over said low dielectric constant insulation layer, inhibiting migration of impurities, including said dopants, from said low dielectric constant insulation layer.

3. An integrated circuit structure comprising:

a) one or more non-porous lower insulation layers;

b) a low dielectric constant insulation layer containing one or more dopants, said low dielectric constant insulation layer having a lower surface formed over said one or more non-porous lower insulation layers, said low dielectric insulation layer formed from:
 i) a non-extractable insulation material selected from the group consisting of an oxide of silicon, silicon nitride, aluminum oxide, and mixtures of same; and
 i) an extractable insulation material selected from the group consisting of germanium oxide, germanium sulfide, and silicon sulfide;

wherein said extractable insulation material is substantially removed, thereby forming a porous structure comprising said low dielectric constant insulation layer comprising a matrix of said non-extractable insulation material and remaining portions of said extractable insulation material not removed; and c) one or more non-porous upper insulation layers formed over an upper surface of said low dielectric constant insulation layer;

whereby said non-porous upper and lower insulation layers serve to encapsulate said upper and lower surfaces of said low dielectric constant insulation layer to inhibit migration of impurities, including said one or more dopants, from said low dielectric constant insulation layer to other portions of said integrated circuit structure.

4. The integrated circuit structure of claim 3 wherein said one or more non-porous lower insulation layers and said one or more non-porous upper insulation layers are each formed from a material selected from the group consisting of an oxide of silicon and silicon nitride.

5. The integrated circuit structure of claim 3 wherein said one or more non-porous lower insulation layers and said one or more non-porous upper insulation layers each consist essentially of an oxide of silicon.

6. The integrated circuit structure of claim 3 wherein said low dielectric constant insulation layer has a thickness of at least about 200 Angstroms.

7. The integrated circuit structure of claim 6 wherein said one or more non-porous lower insulation layers and said one or more non-porous upper insulation layers each has a thickness of at least about 100 Angstroms.

* * * * *